(12) United States Patent
Sternberg et al.

(10) Patent No.: US 10,666,273 B1
(45) Date of Patent: May 26, 2020

(54) SYSTEM AND METHOD FOR VERY LOW FREQUENCY DETECTION OF AN EVENT SIGNATURE

(71) Applicant: The United States of America, as represented by the Secretary of the Navy, San Diego, CA (US)

(72) Inventors: Oren Sternberg, San Diego, CA (US); John Rockway, San Diego, CA (US); Mitchell Lerner, San Diego, CA (US); Israel Perez, San Diego, CA (US); Nicholas Lumsden, Escondido, CA (US)

(73) Assignee: United States of America as represented by Secretary of the Navy, Washington, DC (US)

( * ) Notice: Subject to any disclaimer, the term of this patent is extended or adjusted under 35 U.S.C. 154(b) by 0 days.

(21) Appl. No.: 16/243,830

(22) Filed: Jan. 9, 2019

(51) Int. Cl.
*H03L 7/093* (2006.01)
*G01S 7/288* (2006.01)
*G06F 17/14* (2006.01)
*G01S 5/06* (2006.01)
*G01R 23/02* (2006.01)
*G01S 5/02* (2010.01)

(52) U.S. Cl.
CPC .............. *H03L 7/093* (2013.01); *G01R 23/02* (2013.01); *G01S 5/0215* (2013.01); *G01S 5/06* (2013.01); *G01S 7/288* (2013.01); *G06F 17/142* (2013.01); *G01S 2007/2883* (2013.01)

(58) Field of Classification Search
CPC ..................................................... H03L 7/093

USPC .......................................................... 331/16
See application file for complete search history.

(56) References Cited

U.S. PATENT DOCUMENTS

| 3,137,817 | A | 6/1964 | Sheffet | |
|---|---|---|---|---|
| 3,372,395 | A | 3/1968 | Kline | |
| 2009/0085873 | A1* | 4/2009 | Betts | G08B 13/1427 |
| | | | | 345/169 |
| 2015/0256972 | A1* | 9/2015 | Markhovsky | G01S 5/0215 |
| | | | | 455/456.1 |

OTHER PUBLICATIONS

C. Galambos et al., "Gradient based progressive probabilistic Hough transform," IEE Proceedings—Vision, Image and Signal Processing, vol. 148, No. 3 (Jun. 2001).
C. Jung et al., "Rectangle Detection based on a Windowed Hough Transform," 17th Brazilian Symposium on Computer Graphics and Image Processing, pp. 113-120 (2004).
J. Matas et al., "Robust Detection of Lines Using Progressive Probabilistic Hough Transform," Technical Report: VSSP-TR-2/99, Univ. of Surrey (Oct. 7, 1999).

\* cited by examiner

*Primary Examiner* — Joseph Chang
(74) *Attorney, Agent, or Firm* — Naval Information Warfare Center, Pacific; Kyle Eppele; J. Eric Anderson

(57) ABSTRACT

A system includes a very low frequency (VLF) antenna connected to a circuit that has a high pass filter and a low pass filter. The circuit is configured for noise reduction and frequency localization of detected VLF signals. A receiver is configured to receive filtered VLF signals output by the circuit and to separate desired signals for processing. A display is configured to provide a user with visual feedback based at least in part on an even signature extracted by a digital signal processor (DSP).

12 Claims, 4 Drawing Sheets no detected events detected event

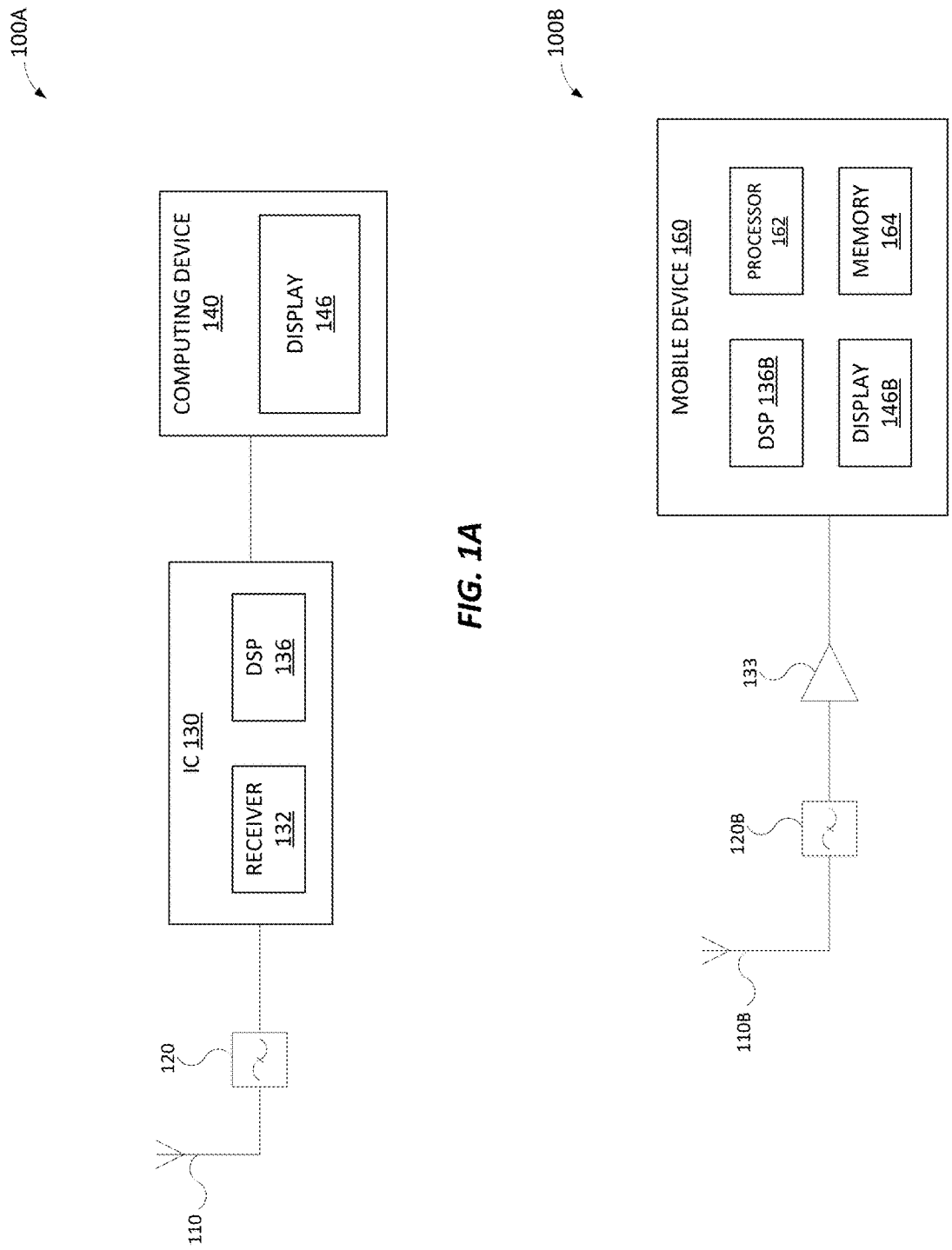

SYSTEM AND METHOD FOR VERY LOW FREQUENCY DETECTION OF AN EVENT SIGNATURE

FEDERALLY-SPONSORED RESEARCH AND DEVELOPMENT

The United States Government has ownership rights in the subject matter of the present disclosure. Licensing inquiries may be directed to the Office of Research and Technical Applications, Space and Naval Warfare Systems Center Pacific, Code 72120, San Diego, Calif. 92152. Phone: (619) 553-5118; email: ssc_pac_t2@navy.mil. Refer to Navy Case No. 103545.

BACKGROUND

Existing automated detection technologies (above ground) are available using radio frequency techniques and protocols such as Bluetooth, Wi-Fi, GSM, etc. Underground non-conductive soil techniques require hard-wiring at a detection distance greater than 10 meters or employing specialized infrasound sensor techniques. A need exists to be able to remotely detect event signatures both above and below ground.

SUMMARY

The present disclosure describes systems and methods for very low frequency detection of an event signature. According to an illustrative embodiment, a system is provided that includes: a very low frequency antenna; a circuit connected to the very low frequency antenna, wherein the circuit includes a high-pass filter and a low-pass filter and is configured for noise reduction and frequency localization of detected very low frequency signals; a receiver configured to receive filtered very low frequency signals output by the circuit and to separate desired signals for processing; a digital signal processor; and a display configured to provide a user with visual feedback based at least in part on an event signature extracted by the digital signal processor.

BRIEF DESCRIPTION OF THE DRAWINGS

Features of illustrative embodiments will be understood from the accompanying drawings, in which similarly-referenced characters refer to similarly-referenced parts. The elements in the drawings may not be drawn to scale. Some elements and/or dimensions may be enlarged or minimized, as appropriate, to provide or reduce emphasis and/or further detail.

FIG. 1A illustrates a block diagram of an embodiment of a system in accordance with the subject matter of the present disclosure.

FIG. 1B illustrates a block diagram of an alternative embodiment of the system.

DETAILED DESCRIPTION OF VARIOUS EMBODIMENTS

Figure 2C:
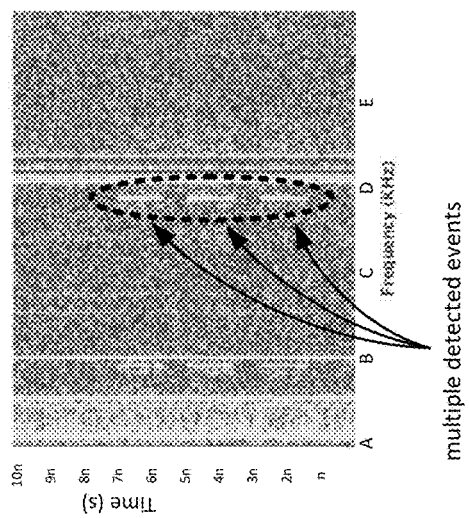
FIGS. 2A-2C show examples of background measurement and detected events in a VLF band.

References in the present disclosure to "one embodiment," "an embodiment," or similar phrases, means that a particular element, feature, structure, or characteristic described in connection with the embodiments is included in at least one embodiment. The appearances of the phrases "in one embodiment," "in some embodiments," and "in other embodiments," or similar phrases, in various places in the present disclosure are not necessarily all referring to the same embodiment or the same set of embodiments.

As used herein, the terms "comprises," "comprising," "includes," "including," "has," "having," or any variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of "the," "a," "an," or similar language, is employed to describe elements and components of the embodiments herein; this is done merely for grammatical reasons and to conform to idiomatic English. This detailed description should be read to include one or at least one, and the singular also includes the plural unless it is clearly meant otherwise.

The embodiments disclosed herein describe a system and method for very low frequency (VLF) detection of an event signature. Such a system/method may be suitable for, e.g., remote detection utilizing a VLF band in various environments. Underground non-conductive soil techniques normally require hard-wiring at a distance greater than 10 meters, whereas the subject matter of the present disclosure enables detection associated with an event signature regardless of whether it is above or below ground.

A system for VLF detection of an event signature has the potential to aid in detection of various types of activity within a VLF band. FIGS. 1A and 1B show embodiments of systems in accordance with the subject matter of the present disclosure. System 100A may include a VLF antenna 110, which may also be referred to as a VLF receiver or a loop antenna, that is configured to detect VLF signals within a VLF band. The detection band may include a range of any frequencies in the VLF band from as low as about 3 kHz to as high as about 60 kHz. VLF antenna 110 may be connected to a circuit 120 including a high pass filter (HPF) and a low pass filter (LPF) to reduce noise. Circuit 120 may be configured for noise reduction and frequency localization of detected VLF signals. Circuit 120 may be connected to a receiver 132, which may be configured to receive filtered VLF signals output by circuit 120 and separate out desired signals for further processing. In some embodiments, receiver 132 may include an amplifier and software, e.g., a software-defined radio (SDR), to process the received filtered VLF signals. Receiver 132 may be connected to a digital signal processor (DSP) 136. A grounded power source (e.g., AC and/or DC, not shown) may be connected to various components in system 100A.

In some embodiments, receiver 132 and DSP 136 may be separate components, while in other embodiments they may be components or modules on the same chip/integrated circuit (IC) such as an application-specific integrated circuit (ASIC) or a field-programmable gate array (FPGA)—FIG. 1A shows an embodiment where IC 130 includes DSP 136 and receiver 132. DSP 136 can perform fast Fourier transform (FFT), linear segmentation, and/or feature extraction on data that is inputted to it for processing. DSP 136 may utilize a progressive probabilistic Hough transform as part of an algorithm to perform processing of streaming data in order to extract an event signature. The event signature may represent an electromagnetic response detected within a VLF band. The event signature may correspond to various types of events. For example, the types of events may include the opening and closing of a door, infrastructure having brush motor settings with a VLF signature, etc. The streaming data may be real-time streaming data in a VLF band and based on the detected VLF signals. The streaming data may be recorded by DSP 136. The algorithm may be applied at a predetermined time interval(s) and may be repeated according to system and/or user configurations (see, e.g., FIGS. 2A-3).

A display 146 may be configured to provide a user with visual feedback (see FIG. 3) as output based at least in part on an event signature extracted by DSP 136. The visual feedback aids a user in identifying event signatures within a VLF band based on the signals detected by VLF antenna 110. Display 146 may be part of a computing device 140, which may contain various additional components and modules not shown but that are readily understood as present by one of ordinary skill in the art (e.g., various types of computer-readable media, a processor(s), input/output ports, an operating system, input/output devices, etc.). In some embodiments, computing device 140 may include components and/or modules configured to perform the functions of a spectrum analyzer and various other functions, whereas in other embodiments computing device 140 may be a spectrum analyzer or may be connected to a spectrum analyzer.

FIG. 1B shows an alternative embodiment of the system shown in FIG. 1A. Elements of system 100B that are substantially similar to system 100A may not be further described. System 100B may include VLF antenna 110B connected to circuit 120B including an HPF and an LPF. Circuit 120B may be connected to amplifier 133, which is configured to amplify/boost the filtered VLF signals output by circuit 120B for further processing. Amplifier 133 may be connected to a mobile device 160 (e.g., via an audio port) including various modules and components for processing the output of amplifier 133. Mobile device 160 may include a processor 162, display 146B, DSP 136B, and memory 164 (there may be additional memory/cache in modules or components other than memory 164). Memory 164 may be non-transitory computer-readable media. In system 100B, mobile device 160 may perform the functions previously described and in keeping with system 100A pertaining to IC 130 and computing device 140.

Figure 2B:
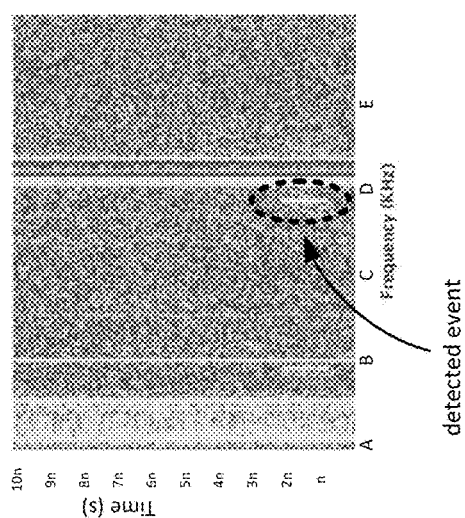
Figure 2A:
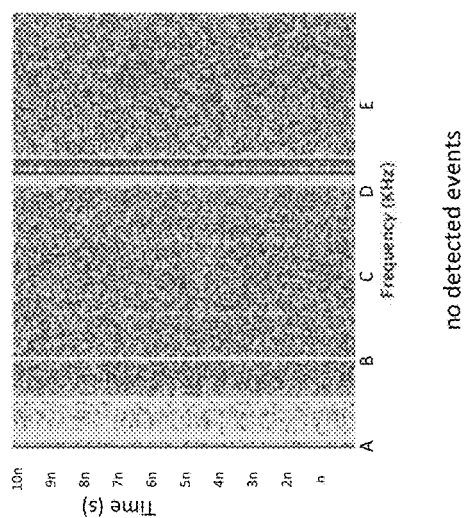

FIGS. 2A-2C show examples of detected events in a VLF band. FIG. 2A shows the results of a background measurement where no event is detected. FIG. 2B shows the results of one event detected. FIG. 2C shows the results of multiple events detected (the number of detected events may be different than the number provided in any of the examples in FIGS. 2A-2C). An event duration may be n number of seconds, wherein n is an integer with a multiplier (e.g., n may be an integer multiplied by 0.429 such that n=20×0.429, which equals 8.58 seconds, 2n would equal 17.16 seconds, etc.). A depth range may be up to about 150 meters depending on the environment, e.g., soil.

Figure 3:
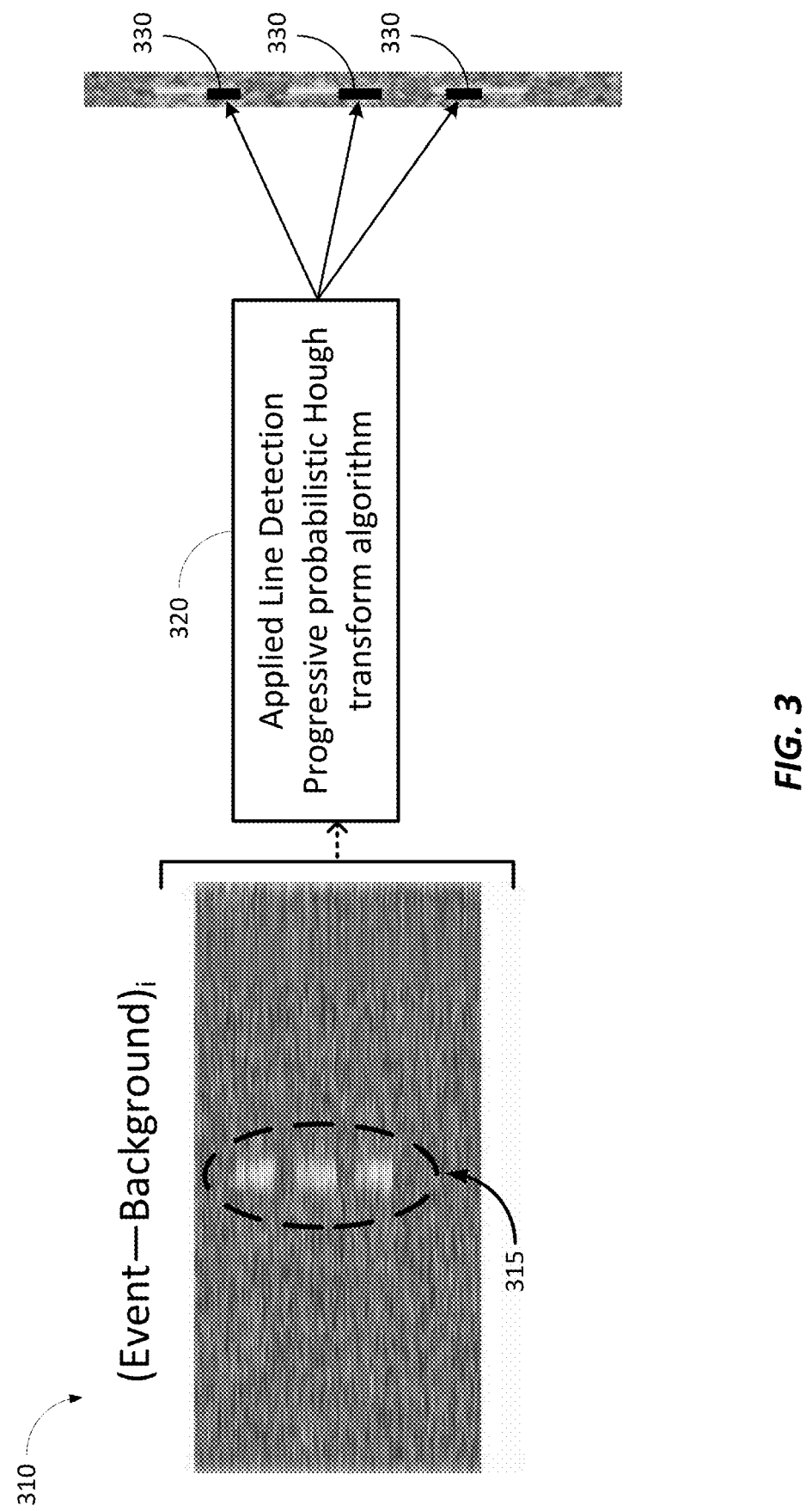
FIG. 3 shows an example of an applied algorithm using a Hough transform for event detection via image processing of data.

FIG. 3 shows an example of an image processing technique 300 where detected events 315 in a VLF band are extracted using an applied line detection progressive probabilistic Hough transform algorithm 320. The detected events 315 are extracted from the background (Event-Background), 310, wherein i represents an ith frame of data in which an event(s) 315 is detected, and the algorithm 320 applies an indicator/marking 330 for each extracted event signature 315. In the FIG. 3 example, the applied line detection results in a visual marking 330 being placed on each of the event signatures 315 as shown, and visual markings 330 may be output as visual feedback on a display along with other information pertaining to the event signatures 315 (see FIGS. 2A-2C, showing time and frequency information). In this example, the events are detected at a frequency between C and D. The VLF frequency range from A to E is an example in which the lettered frequencies are within a VLF band and have equivalent frequency increments therebetween.

Figure 4:
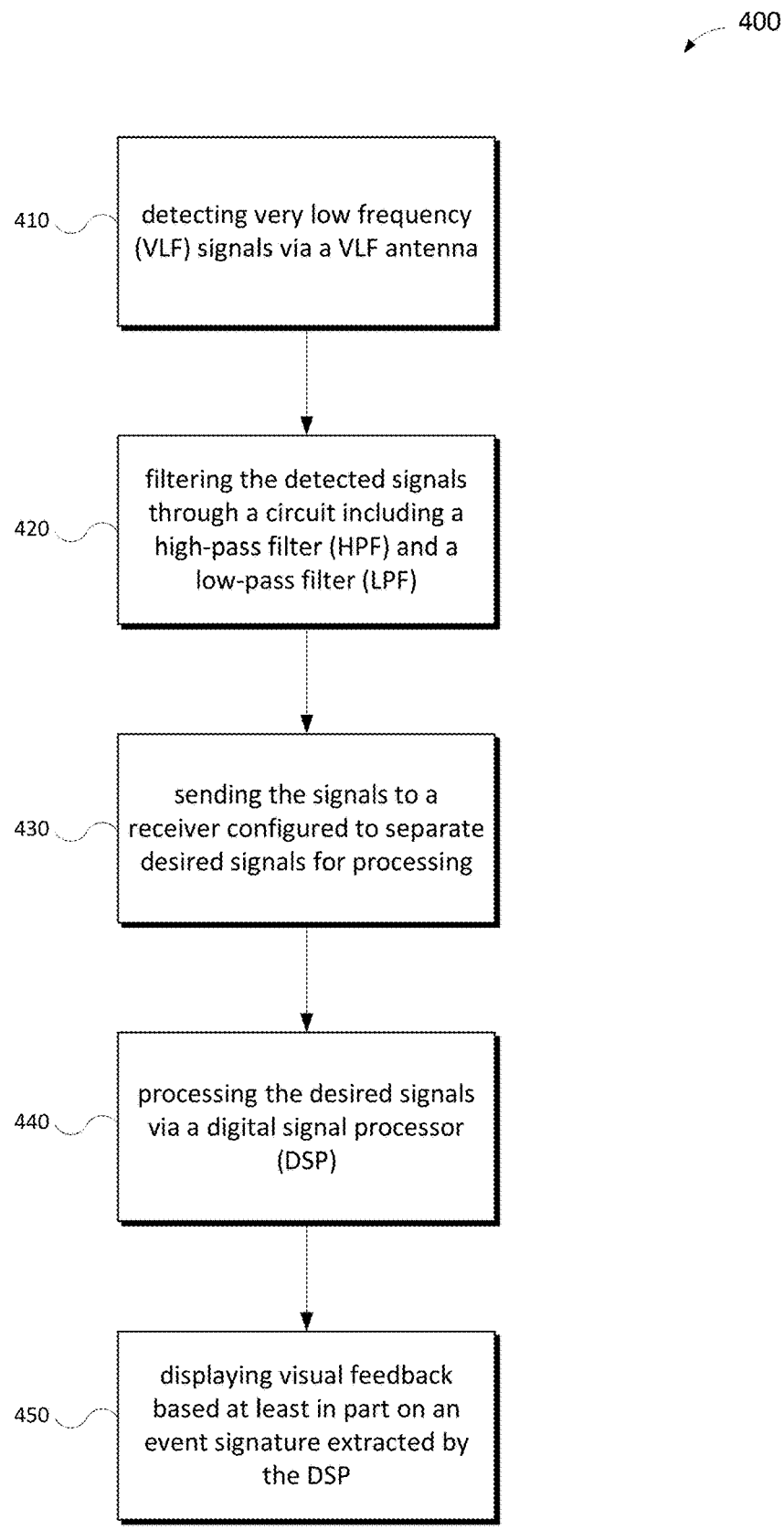
FIG. 4 illustrates a flowchart of an embodiment of a method in accordance with the subject matter of the present disclosure.

FIG. 4 illustrates a block diagram of an embodiment of a method in keeping with the subject matter of the present disclosure. Method 400 may be implemented as a series of modules, and the modules may function in concert with physical electronic and computer hardware devices. Such modules may be utilized separately and/or together, locally and/or remotely, to form a program product thereof, which may be implemented through recordable media. Some or all of the steps of method 400 may be stored within non-transitory computer-readable media, and the steps may be represented by computer-readable programming code.

For illustrative purposes, method 400 will be discussed with reference to various other figures. Additionally, while FIG. 4 shows an embodiment of method 400, other embodiments of method 400 may contain fewer or more steps. Although in some embodiments the steps of method 400 may be performed as shown in FIG. 4, in other embodiments the steps may be performed in a different order, or certain steps may occur simultaneously with one or more other steps. Method 400 may contain features/steps that are substantially similar or identical to systems 100A and 100B; such features/steps may not be further described.

Step 410 includes detecting VLF signals via VLF antenna 110. The detection band for the VLF signals may include a range of any frequencies in the VLF band from as low as about 3 kHz to as high as about 60 kHz.

Step 420 includes filtering the detected signals through circuit 120, which includes an HPF and an LPF. Circuit 120 may be configured for noise reduction and frequency localization of the detected VLF signals.

Step 430 includes sending the filtered signals to receiver 132 configured to separate desired signals for processing. In some embodiments, receiver 132 may be included in an IC having other components/modules, whereas in other embodiments receiver 132 may be a standalone component.

In some embodiments, the filtered signals are sent to amplifier 133, which is configured to amplify/boost the filtered VLF signals output by the circuit for further processing (as shown in FIG. 1B, circuit 120B), and amplifier 133 may be connected to mobile device 160.

Step 440 includes processing the desired signals via DSP 136. In some embodiments, DSP 136 may be included in the same IC as receiver 132, whereas in other embodiments DSP 136 may be a standalone component. In still other embodiments, DSP 136 may be included in mobile device 160 (shown as DSP 136B in FIG. 1B).

Step 450 includes displaying visual feedback (e.g., via display 146 or 146B) based at least in part on an event signature extracted by DSP 136 (see FIG. 3).

In some embodiments, method 400 may further comprise a step for recording real-time streaming spectrum data in a VLF band via DSP 136, wherein the streaming data is based on the detected VLF signals.

In some embodiments, method 400 may further comprise utilizing, via DSP 136, a progressive probabilistic Hough transform as part of an algorithm to perform processing of the streaming data, wherein the processing extracts an event signature. As shown in FIG. 3, an event signature(s) 315 may be labeled with a visual indicator/marking 330 in order to aid a user in identifying the extracted event.

In some embodiments, method 400 may further comprise applying the algorithm at a predetermined time interval(s) according to system and/or user configurations.

The use of any examples, or example-language ("e.g.," "such as," etc.), provided herein is merely intended to better illuminate and is not intended to pose a limitation on the scope of the subject matter unless otherwise claimed. No language in the present disclosure should be construed as indicating that any non-claimed element is essential.

Many modifications and variations of the System And Method For Very Low Frequency Detection Of An Event Signature are possible in light of the above description. It should be understood that features described in certain embodiments may be present in, or applicable to, other embodiments although not expressly described in the other embodiments. Within the scope of the appended claims, the embodiments described herein may be practiced otherwise than as specifically described. The scope of the claims is not limited to the disclosed implementations and embodiments but extends to other implementations and embodiments as may be contemplated by those having ordinary skill in the art.

What is claimed is:

1. A method for detecting the opening and closing of motorized doors comprising:
    detecting very low frequency (VLF) electromagnetic signals via a VLF antenna;
    filtering the detected signals through a circuit including a high-pass filter (HPF) and a low-pass filter (LPF), wherein the circuit is configured for noise reduction and frequency localization of the detected signals;
    recording real-time streaming spectrum data in a VLF band via a digital signal processor (DSP); and
    utilizing a progressive probabilistic Hough transform via the DSP to perform image processing of the streaming spectrum data, wherein the processing extracts an event signature associated with a motorized door opening and closing.

2. The method of claim 1, wherein the motorized doors are located in an underground structure and the VLF antenna is located above a ground surface.

3. The method of claim 2, wherein the underground structure is at least ten meters below the ground surface.

4. The method of claim 3, wherein no hard-wiring exists between the VLF antenna and the underground structure.

5. The method of claim 4, wherein the ground is non-conductive.

6. The method of claim 1, wherein the progressive probabilistic Hough transform is a line detection algorithm.

7. The method of claim 6, further comprising the following steps:
    extracting a detected line that is representative of a given detected event signature from a background; and
    applying a visual marking on a display over each detected line in the spectrum data.

8. The method of claim 7, further comprising the step of displaying time and frequency information on the display along with the visual marking.

9. The method of claim 8, wherein the motorized doors are located in an underground structure and the VLF antenna is located above a ground surface.

10. The method of claim 9, wherein the underground structure is at least ten meters below the ground surface.

11. The method of claim 10, wherein no hard-wiring exists between the VLF antenna and the underground structure.

12. The method of claim 11, wherein the ground is non-conductive.

* * * * *